(12) United States Patent
Lee et al.

(10) Patent No.: US 12,154,809 B2
(45) Date of Patent: Nov. 26, 2024

(54) AUTOMATED MATERIAL HANDLING SYSTEMS

(71) Applicant: Taiwan Semiconductor Manufacturing Co., Ltd., Hsinchu (TW)

(72) Inventors: Yen Le Lee, Hsinchu (TW); Yen-Yu Chen, Taichung (TW); Wei Chih Chen, Taichung (TW); Tai Hsiang Liao, Hsinchu (TW); Kai-Ping Chan, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 922 days.

(21) Appl. No.: 17/126,872

(22) Filed: Dec. 18, 2020

(65) Prior Publication Data

US 2021/0242057 A1 Aug. 5, 2021

Related U.S. Application Data

(60) Provisional application No. 62/968,048, filed on Jan. 30, 2020.

(51) Int. Cl.
*H01L 21/00* (2006.01)
*H01L 21/677* (2006.01)

(52) U.S. Cl.
CPC .. *H01L 21/67733* (2013.01); *H01L 21/67706* (2013.01); *H01L 21/67736* (2013.01)

(58) Field of Classification Search
None
See application file for complete search history.

(56) References Cited

U.S. PATENT DOCUMENTS

| | | | |
|---|---|---|---|
| 2003/0062578 A1* | 4/2003 | Dougan | H01L 21/67379 257/414 |
| 2008/0021593 A1* | 1/2008 | Yu | G05B 19/4189 700/228 |
| 2008/0147306 A1 | 6/2008 | Hayashi | |
| 2011/0218662 A1* | 9/2011 | Nakata | H01L 21/67201 700/112 |

(Continued)

FOREIGN PATENT DOCUMENTS

| | | |
|---|---|---|
| CN | 101195346 A | 6/2008 |
| CN | 203481872 U | 3/2014 |
| CN | 104426236 A | 3/2015 |

(Continued)

*Primary Examiner* — Paul B Yanchus, III
(74) *Attorney, Agent, or Firm* — Seed IP Law Group LLP (57) ABSTRACT

An overhead transport vehicle is described for association with an Automated Material Handling System (AMHS). The overhead transport vehicle provides features to the AMHS by which the AMHS is able to reduce a number of manual urgent lot rescues by the fab operator when a logistic algorithm controlling traffic in the AMHS is unable to transport the front opening unified pods (FOUP) from one tool to the subsequent tool in the sequence of the process steps within the q-time due to unexpected problems. An indicator on the overhead transport vehicle which helps the fab operator with spotting a lot in trouble is described. A backup power source on the overhead transport vehicle used in case of a main power failure is also described.

20 Claims, 7 Drawing Sheets

(56) References Cited

U.S. PATENT DOCUMENTS

2017/0090465 A1\* 3/2017 You ................. G05B 19/41865

FOREIGN PATENT DOCUMENTS

| | | | |
|---|---|---|---|
| CN | 108340350 | A | 7/2018 |
| CN | 110648954 | A | 1/2020 |
| KR | 10-2019-0139059 | A | 12/2019 |
| TW | 387853 | B | 4/2000 |
| TW | 432471 | B | 5/2001 |
| TW | 200301748 | A | 7/2003 |
| TW | 200403791 | A | 3/2004 |
| TW | 200415094 | A | 8/2004 |
| TW | 201335726 | A | 9/2013 |
| TW | 201447526 | A | 12/2014 |
| TW | 201708082 | A | 3/2017 |
| TW | 201742816 | A | 12/2017 |
| TW | 201841791 | A | 12/2018 |
| TW | 201904853 | A | 2/2019 |
| TW | 201924184 | A | 6/2019 |

\* cited by examiner

AUTOMATED MATERIAL HANDLING SYSTEMS

PRIORITY CLAIM AND CROSS-REFERENCE

This application claims the benefit of U.S. Provisional Patent Application No. 62/968,048, filed Jan. 30, 2020, which is incorporated by reference herein in its entirety.

BACKGROUND

To produce semiconductor devices, a semiconductor substrate, such as a silicon wafer, which is a raw material for the semiconductor devices, must go through a sequence of complicated and precise process steps. Often, to complete the sequence, the wafer must be physically transported from one piece of fabrication equipment to another piece of fabrication equipment. Within these pieces of fabrication equipment, various processes such as diffusion, ion implantation, chemical vapor deposition, photolithography, etch, physical vapor deposition, and chemical mechanical polishing are carried out on the semiconductor substrate. To efficiently move the semiconductor substrate through the sequence and between the different pieces of fabrication equipment in a semiconductor fabrication plant (commonly called as "fab"), a plurality of semiconductor substrates (wafers) are housed in a front opening unified pod (FOUP) and an automated material handling system (AMHS) is implemented in the fab to move the FOUP from one piece of fabrication equipment to another piece of fabrication equipment.

Generally, a plurality of overhead transport vehicles is a part of the AMHS in the fab. The overhead transport vehicles are utilized to transport the FOUP by traveling on an overhead track from one process equipment (commonly called a "tool") to another tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An overhead transport vehicle is utilized in a fab to transport a FOUP by traveling on an overhead track from one tool to another tool within a process time constraint information (q-time). The q-time limits an interval time between two or more tools (or process steps) in the sequence of process steps. The q-time is one of the important considering factors in semiconductor fabrication processes. The q-time is set to ensure that deposited layers or process structures on the substrates (wafers) are free from contamination such as excessive oxidation and particles before the wafers are transported to a subsequent tool (or next process step) in the sequence. When a logistic algorithm controls traffic in the AMHS is unable to transport the FOUP from one tool to the subsequent tool in the sequence of the process steps within the q-time due to unexpected problems (such as power outage), the wafers are often scrapped.

Embodiments in accordance with the subject matter described herein include an AMHS and an overhead transport vehicle (integrated into the AMHS) that are able to work together to reduce a number of manual urgent lot rescues by a fab operator. As used herein, unless otherwise specifically indicated, the term "lot" refers to a group of substrates (wafers) that are housed in a wafer cassette (i.e., FOUP). As discussed above, the wafer cassette is transported by the overhead transport vehicle that travels on the overhead track. Embodiments of an AMHS capable of reducing the number of the manual urgent lot rescues include one or more indicators located on the overhead transport vehicle or the wafer cassette that displays a level of urgency for the lot with respect to one or more considering factors such as the remaining q-time for the lot. For a non-limiting example, the indicator displays a noticeable color (i.e., red and yellow) to indicate to the fab operator that the overhead transport vehicle is carrying an urgent lot without a sufficient amount of q-time remaining. If a manual rescue is necessary, the fab operator can easily identify the urgent lot by the color (or other noticeable features such as lot identifier) on the indicator.

Figure 1:
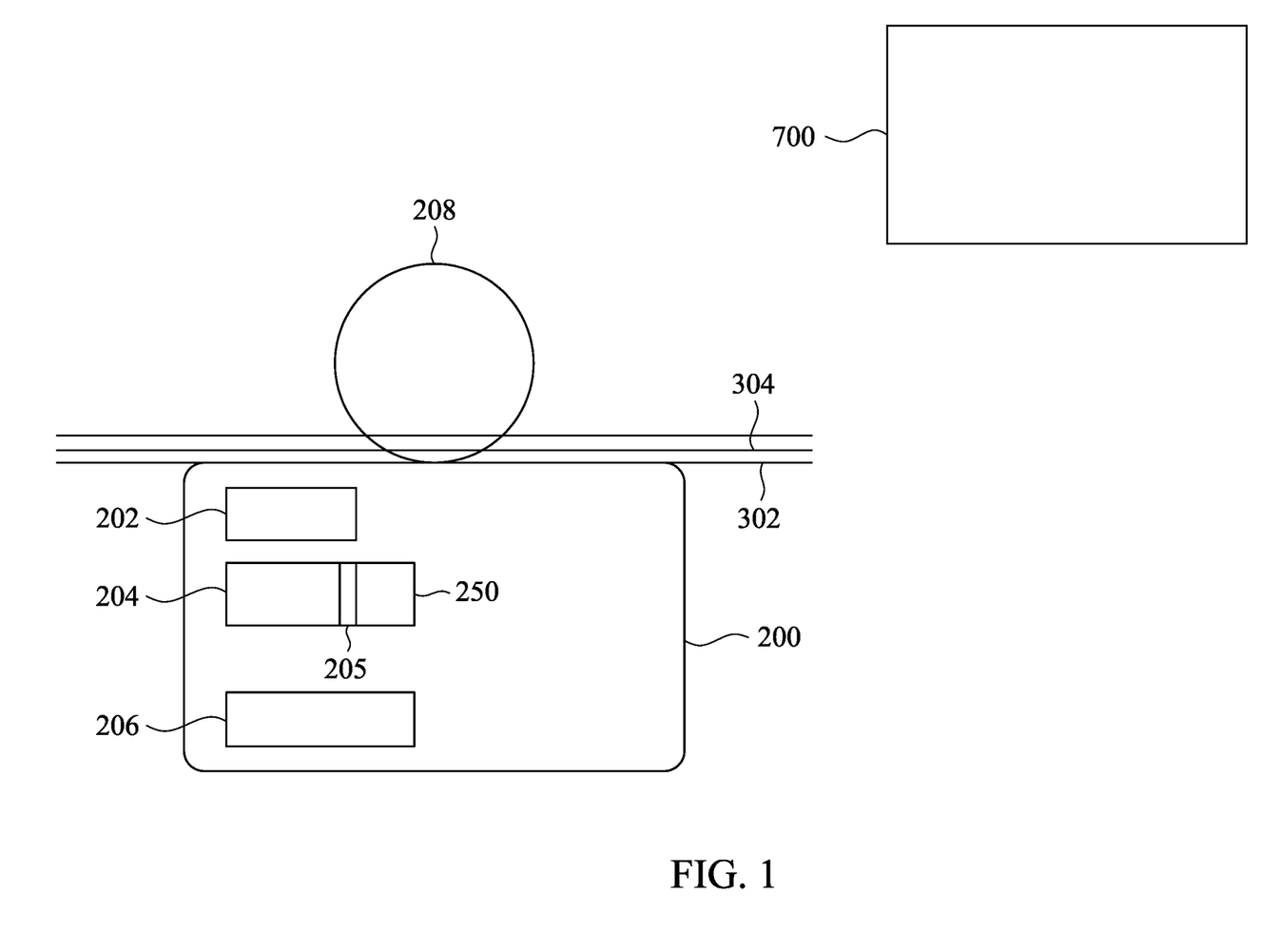
FIG. 1 is a schematic view of an overhead transport vehicle 200 on an overhead track 302 carrying a lot according to one or more embodiments of the present disclosure.

FIG. 1 is a schematic view of the overhead transport vehicle 200 on the overhead track 302 carrying a lot according to one or more embodiments of the present disclosure.

Referring to FIG. 1, the overhead transport vehicle 200 includes a power control circuit 202, a backup power source 204, a battery indicator 206 for the backup power source 204, and a driving mechanism 208 for moving the overhead transport vehicle 200 on the overhead track 302. Power control circuit 202 is included in a processing circuit 210 in FIG. 2.

In accordance with some embodiments of the present disclosure, the power control circuit 202 determines a source of power that drives the driving mechanism 208 to move overhead transport vehicle 200. In the illustrated embedment, the driving mechanism 208 of the overhead transport vehicle 200 on the overhead track 302 receives power from the overhead track 302 that includes a power rail 304. Power rail 304, which serves as a contact power supplier, supplies a main source of power for the overhead transport vehicle 200.

In a typical normal operating situation, the power rail 304 supplies the power in a suitable form (i.e., current type, current, and voltage) to drive the overhead transport vehicle 200. In some embodiments of the present disclosure, the power control circuit 202 measures the power (i.e., current type, current, and voltage) from the power rail 304 continuously or regularly to monitor that the power supplied from the power rail 304 is within a predetermined power specification to drive the overhead transport vehicle 200.

For a non-limiting example, in response to insufficient power supplied from the power rail 304 (i.e., incorrect current, incorrect voltage, and power outage), the power control circuit 202 switches the power source that drives the overhead transport vehicle 200 from the power rail 304 to a backup power source 204. In some embodiments of the present disclosure, the power control circuit 202 checks the power supplied from the power rail 304 while the overhead transport vehicle is powered by the backup power source 204. If the power control circuit 202 determines that the power measured from the power rail 304 is sufficient to drive the overhead transport vehicle 200, the power control circuit 202 switches the source of the power for the overhead transport vehicle 200 back to the power rail 304.

In some embodiments of the present disclosure, the power control circuit 202 monitors a charging level of the backup power source 204. Based on the charging level of the backup power source 204, the power control circuit 202 charges the backup power source 204 by supplying the power from the power rail 304.

In some embodiments of the present disclosure, the power control circuit 202 outputs a status of the backup power source 204 to indicate the status of the backup power source 204 to the fab operator. For non-liming examples, the power control circuit 202 displays a red-light bar in the battery indicator 206 to indicate a failure of the backup power source 204. Similarly, the power control circuit 202 displays a yellow-light bar in the battery indicator 206 to indicate that the backup power source 204 is being charged. Power control circuit 202 displays a blinking yellow-light bar in the battery indicator 206 to indicate that the life of the backup power source 204 is coming to an end soon. Power control circuit 202 displays a green-light bar in the battery indicator 206 to indicate that the backup power source 204 is in a good condition. In accordance with embodiments of the present disclosure, the battery indictor 206 can display the status of the backup power source 204 in any suitable fashion. While red and yellow light bars have been described above as examples of indicators of the condition of the backup power source, other embodiments of the present disclosure utilize different indicators of the condition of the backup power source. For example, such other types of indicators include different colored indicators, reader boards, and visual indicators, such as those described below. In other embodiments, nonvisual indicators can be utilized, for example, audible indicators.

In accordance with some embodiments of the present disclosure, the backup power source 204 is a rechargeable battery. For non-limiting examples, the backup power source 204 includes at least one of lead-acid, nickel-cadmium (NiCd), nickel-metal hydride (NiNM), lithium-ion (Li-ion), or lithium-ion polymer (Li-ion polymer). However, the present disclosure does not limit the type of the backup power source 204. For a non-limiting example, in some embodiments of the present disclosure, the backup power source 204 is a non-rechargeable battery or an ultra-capacitor.

The backup power source 204 includes two or more batteries in some embodiments of the present disclosure. For a non-limiting example, the backup power source 204 includes at least one main battery and one or more backup batteries. The backup battery serves as a backup for the main battery in case of failure in the main battery. In some embodiments of the present disclosure, the overhead transport vehicle 200 includes more than one battery to extend the operating time of the overhead transport vehicle 200 when the overhead transport vehicle 200 is powered by the backup power source 204. The number of batteries installed in the overhead transport vehicle 200 is determined by considering one or more factors, such as weight limit of the overhead track 302, fab layout, and frequency of power failure in the fab.

In accordance with some embodiments of the present disclosure, the backup power source 204 is not hardwired to the overhead transport vehicle 200. For a non-limiting example, the overhead transport vehicle 200 includes a plug-in connector 250 for the backup power source 204. Backup power source 204 includes a corresponding connector 205 that is configured to connect to the plug-in connector 250 of the overhead transport vehicle 200. In some embodiments of the present disclosure, the overhead transport vehicle 200 includes more than one plug-in connector 250 to accommodate multiple batteries at the same time.

Figure 2:
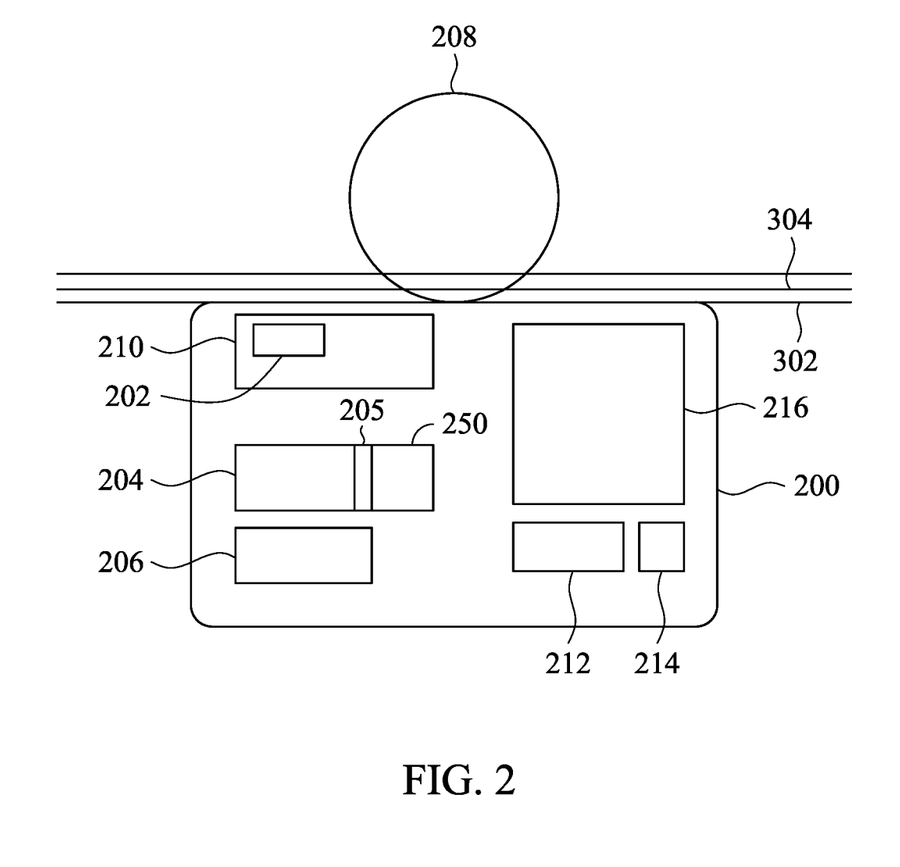
FIG. 2 is a schematic view of the overhead transport vehicle 200 including a priority indicator 216 according to one or more embodiments of the present disclosure.

FIG. 2 is a schematic view of the overhead transport vehicle 200 including the priority indicator 216 according to one or more embodiments of the present disclosure.

Referring to FIG. 2, the overhead transport vehicle 200 includes the processing circuit 210, a memory 212, a communication circuit 214, and a priority indicator 216 that indicates the level of urgency for the lot transported by the overhead transport vehicle 200.

Processing circuit 210 may be or includes the computer processor configured to perform the various functions and operations described herein including determining and outputting the level of urgency, determining the source of power for the overhead transport vehicle 200, and communicating with a controller in the AMHS via the communication circuit 214. Communication circuit (or communication processing circuit) 214 may be or include one or more input and/or output terminals that are communicatively coupled to the controller in the AMHS (using suitable communication protocols such as TCP/IP). Communication circuit 214 may be used to communicate with the controller in the AMHS using wire and/or wireless technology. Memory 212 may be or include any computer-readable storage medium, including, for example, read-only memory (ROM), random access memory (RAM), flash memory, hard disk drive, optical storage device, magnetic storage device, electrically erasable programmable read-only memory (EE-PROM), organic storage media, or the like. For a non-limiting example, a programmable logic controller (PLC) system includes the processing circuit 210, the power control circuit 202, and the communication circuit 214. For another non-limiting example, electrical or electronic components of the processing circuit 210, the power control circuit 202, and the communication circuit 214 are electrically connected on one or more than one printed circuit board (PCB).

As discussed above, in some instances, the level of urgency for the lot is determined with respect to the remaining q-time for the lot. In some embodiments of the present disclosure, the level of urgency for the lot is also determined by other factors such as production deadline for the lot. In some embodiments of the present disclosure, the priority indicator 216 is located on the wafer cassette.

In some embodiments of the present disclosure, the priority indicator 216 and/or battery indicator 206 includes any suitable display hardware and/or software such as liquid-crystal display (LCD), organic light-emitting diode display (OLED), light-emitting diode display (LED display), and dot-matrix display.

Figure 3:
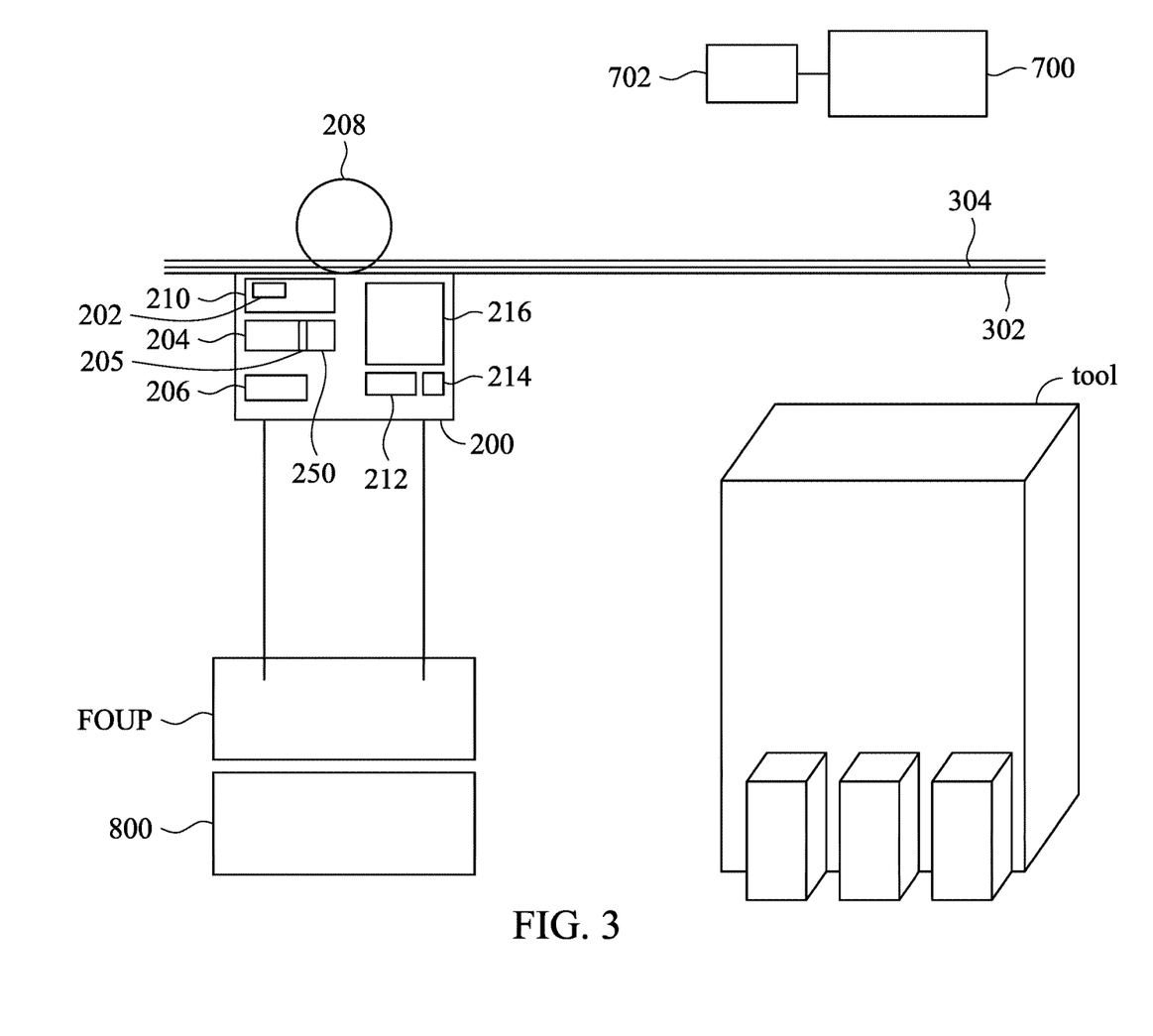
FIG. 3 is a schematic view of the overhead transport vehicle 200 on the overhead track 302 communicating with a controller 700 in the AMHS according to one or more embodiments of the present disclosure.

In some embodiments of the present disclosure, the communication circuit 214 receives a sequence of process steps for the lot from the controller 700 in the AMHS. Controller 700 in the AMHS may be or includes the computer processor configured to perform the various functions and operations described herein including running the logistic algorithm controls traffic in the AMHS. The sequence of process steps includes at least one sequence of process steps (the sequence of different tools that the lot must move through) for the lot. In some embodiments of the present disclosure, along the sequence of process steps, the sequence of process steps includes route information for the lot (i.e., the distance between a preceding tool (process step) and a following tool (process step) in the sequence of process steps). The sequence of process steps includes a time constraint information for intervals between two or more process steps (tools) in the sequence of process steps. As discussed above, the time constraint is often called the q-time. The q-time limits an interval time between two or more tools (or process steps) in the sequence of process steps. As discussed above, the q-time is set to ensure that deposited layers or process structures on the substrates (wafers) are free from contamination such as excessive oxidation and particles before the wafers are transported to the next tool or process step in the sequence.

In some embodiments of the present disclosure, the memory 212 stores the sequence of process steps for each of the lots the overhead transport vehicle 200 is assigned to transport. As discussed above, the sequence of process steps includes the time constraint information (q-time) for the lot.

In some embodiments of the present disclosure, the processing circuit 210 determines the level of urgency for the lot transported by the overhead transport vehicle 200 based on the sequence of process steps stored in the memory 212 and current progress of the lot in the sequence of process steps. For a non-limiting example, the processing circuit 210 determines whether the lot being transported by the overhead transport vehicle 200 will be available at the next process step location within the remaining q-time. Based on the determination, the processing circuit 210 outputs different indicators (messages) on the priority indicator 216 based on the remaining q-time.

In some embodiments of the present disclosure, the processing circuit 210 determines the level of urgency based on different remaining q-times for the lot. For a non-limiting example, if the lot has the remaining q-time within a predetermined time range A (such as 420 seconds or less) to get to the next tool location (process step), the processing circuit 210 outputs the highest level urgent indicator (message) on the priority indicator 216 indicating that the lot has no or short q-time remaining. Similarly, if the lot has the remaining q-time within a predetermined time range B (such as between 421 seconds and 840 seconds), the processing circuit 210 outputs an urgent indicator on the priority indicator 216 indicating that the lot has short q-time remaining. If the lot has the remaining q-time within a predetermined time range C (such as between 841 seconds or more), the processing circuit 210 outputs an indicator (message) on the priority indicator 216 indicating that the lot has enough q-time remaining. For an illustration purpose, in the example above, the q-time was divided into range A, range B, and range C for determining the level of urgency for the lot. However, the present disclosure does not limit to the above example. For non-limiting example, the present disclosure includes other determining factors such as estimated travel time for the lot, a lot type for the lot (i.e., non-reworkable lot and reworkable lot), production deadline, and history data from a similar sequence of process steps, and/or a production deadline assigned for the lot.

The indicator (message) on the priority indictor 216 can be configured in any suitable format (letter, color, flashing effect, and shape) that can be easily recognized by a fab operator.

In some embodiments of the present disclosure, the processing circuit 210 determines the level of urgency based on the remaining q-time and the route information for the lot. Processing circuit 210 outputs the indicator (message) on the priority indicator 216 based on the urgency determined by the processing circuit 210. Processing circuit 210 determines whether the lot being transported by the overhead transport vehicle 200 will be available at the next tool location (process step) within the remaining q-time based on the route information (i.e., distance to the next tool and speed at which the overhead transport vehicle 200 is traveling).

For non-limiting examples, the processing circuit 210 determines a travel time required for the overhead transport vehicle 200 traveling from the current location to the next tool location (process step) based on the distance to the next tool location (process step) and speed at which the overhead transport vehicle 200 is traveling. Based on the determined travel time, the processing circuit 210 further determines whether the lot will be available at the next tool location (next step) within the remaining q-time. If the processing circuit 210 determines that the determined travel time is more than the remaining q-time by some predetermined threshold, e.g., 60 seconds or greater, the processing circuit 210 outputs the highest-level urgent indicator (message) on the priority indicator 216 indicating that the lot has insufficient q-time remaining and the lot will not reach the next tool before expiration of the q-time. If the processing circuit 210 determines that the determined travel time and the remaining q-time are the same or within some predetermined threshold of each other, e.g., 0 to 60 seconds, the processing circuit 210 outputs the urgent indicator (message) on the priority indicator 216 indicating that the lot will reach the next tool location at the time of expiration of the q-time or after the q-time has expired. If the processing circuit 210 determines that the remaining q-time is greater than the determined travel time by some predetermined threshold, e.g., greater than 60 seconds, the processing circuit 210 outputs the indicator (message) on the priority indicator 216 indicating that that the lot has enough q-time remaining so that the overhead transport vehicle 200 will reach the next tool location before expiration of the q-time.

In some embodiments of the present disclosure, other considering factors can be used along with the q-time such as a lot type for the lot (i.e., non-reworkable lot and reworkable lot), history data from a similar sequence of process steps, or a production deadline assigned for the lot. It is important to distinguish the lot type since the non-reworkable lot may be scrapped after the q-time has passed. However, reworkable lot can be revived through additional process steps. Thus, the non-reworkable lot has a priority over the reworkable lot. For a non-limiting example, even though the processing circuit 210 determines that the remaining q-time is greater than the determined travel time by some predetermined threshold, e.g., greater than 60 seconds, the processing circuit 210 outputs the highest-level urgent indicator on the priority indicator 216 based on the production deadline. The fab operator can assign different considering weights for each of the considering factors.

In some embodiments of the present disclosure, the processing circuit 210 determines the level of urgency based on the remaining q-time, the route information for the lot, speed of the overhead transport vehicle 200 and current traffic information. Processing circuit 210 outputs different levels of the urgent indicator (message) on the priority indicator 216 when the processing circuit 210 determines that the lot will not be available to the next tool location (process step) within the remaining q-time based on the route information (i.e., distance to the next tool), overhead transport vehicle speed and the current traffic information received from the controller 700 in the AMHS.

For non-limiting examples, the processing circuit 210 determines a travel time required for the overhead transport vehicle 200 traveling from the current location to the next tool location (process step) based on the distance to the next tool location (process step) and the current traffic information on the route to the next tool location (process step). For a non-limiting example, the processing circuit 210 adds a predetermined time (i.e., five seconds) to the travel time (which was determined based on the distance to the next tool location) for each overhead transport vehicle on the route to the next tool location (process step).

Based on the determined travel time utilizing the current traffic information on the route to the next tool, the processing circuit 210 further determines whether the lot will be available to the next tool location (next step) within the remaining q-time. If the processing circuit 210 determines that the determined travel time, taking into account the current traffic information, is more than the remaining q-time by some predetermined threshold, e.g., 60 seconds or greater, the processing circuit 210 outputs the highest-level urgent indicator (message) on the priority indicator 216 indicating that the lot has insufficient q-time remaining and will not reach the next tool before expiration of the q-time. If the processing circuit 210 determines that the determined travel time, taking into account the current traffic information, and the remaining q-time are the same or within some predetermined threshold of each other, e.g., 0 to 60 seconds, the processing circuit 210 outputs the urgent indicator (message) on the priority indicator 216 indicating that the lot will reach the next tool location at the time of expiration of the q-time or after the q-time has expired. If the processing circuit 210 determines that the remaining q-time is greater than the determined travel time by some predetermined threshold, e.g., greater than 60 seconds, taking into account the current traffic information, the processing circuit 210 outputs the indicator (message) on the priority indicator 216 indicating that the lot has sufficient q-time remaining so that the overhead transport vehicle 200 will reach the next tool location before expiration of the q-time.

In some embodiments of the present disclosure, the processing circuit 210 determines the level of urgency based on the remaining q-time, the route information for the lot, the current traffic information, and prior history data from the lots with a similar sequence of the process steps. Processing circuit 210 determines whether the lot being transported by the overhead transport vehicle 200 will be available at the next tool location (process step) within the remaining q-time based on the route information (i.e., distance to the next tool), the current traffic information, and the prior history data.

In some embodiments of the present disclosure, the prior history data is collected by the controller 700 in the AMHS and is transmitted to the overhead transport vehicle 200. In some embodiments of the present disclosure, the prior history data is collected by the processing circuit 210 of the overhead transport vehicle 200 and stored in the memory 212. In some embodiments of the present disclosure, the prior history data stored in the memory 212 is combined with the prior history data collected from the controller 700 of the AMHS. In accordance with embodiments of the present disclosure, examples of prior history data include prior travel time under various conditions such as traffic information, and distance to the next tool location (process step).

For a non-limiting example, the processing circuit 210 determines the travel time required for the overhead transport vehicle 200 traveling from the current location to the next tool location (process step) based on the prior history data that matches with conditions such as distance to the next tool location (process step), and the current traffic information on the route to the next tool location (process step). If there is no exact matching prior history data with the current conditions for the lot, the processing circuit 210 determines a preliminary travel time based on the prior history data that is close to the current conditions and further adjusts the preliminary travel time based on conditions not matched with the prior history data. For a non-limiting example, the processing circuit 210 determines the travel time based on the prior history data based on the distance to the next tool location (process step) and adjusts the travel time based on non-matching conditions, such as traffic information and/or route information, by adding the predetermined time (i.e., five seconds) for each overhead transport vehicle on the route to the next tool location (process step). While traffic information and route information have been described as examples of non-matching conditions, in accordance with some embodiments of the present disclosure, other conditions related to the transport of the lots from one tool to another can be utilized as prior history data and non-matching conditions.

Based on the determined travel time based on prior history data, the processing circuit 210 further determines whether the lot will be available at the next tool location (next step) within the remaining q-time. If the processing circuit 210 determines that the determined travel time, taking into consideration the prior history data, is more than the remaining q-time by some predetermined threshold, e.g., 60 seconds or greater, the processing circuit 210 outputs the highest-level urgent indicator (message) on the priority indicator 216 indicating that the lot has insufficient q-time remaining and will not reach the next tool before expiration of the q-time. If the processing circuit 210 determines that the determined travel time, taking into consideration the prior history data, and the remaining q-time are the same or within some predetermined threshold of each other, e.g., 0 to 60 seconds, the processing circuit 210 output the urgent indicator (message) on the priority indicator 216 indicating that the lot will reach the next tool location at the time of expiration of the q-time or after the q-time has expired. If the processing circuit 210 determines that the remaining q-time is greater than the determined travel time by some predetermined threshold, e.g., greater than 60 seconds, taking into account the prior history data, the processing circuit 210 outputs the indictor on the priority indicator 216 indicating that the lot has sufficient q-time remaining so that the overhead transport vehicle 200 will reach the next tool location before expiration of the q-time.

In some embodiments of the present disclosure, the controller 700 in the AMHS determines the level of urgency based on types of the lot and the remaining q-time for the lot. For a non-limiting example, the q-time is strictly enforced to a certain type of lot that cannot be revived or reworked and the q-time is less strictly enforced to other types of lots that can be reworked through additional process steps. After q-time has passed for the lot that cannot be revived or reworked, the whole lot may be scrapped.

In some embodiments of the present disclosure, the controller 700 in the AMHS outputs the level of urgency on the priority indicator 216. Some non-limiting examples are described here. Controller 700 in the AMHS outputs a red or a yellow bar on the priority indicator 216 indicating that the overhead transport vehicle 200 is transporting a lot that cannot be revived or reworked regardless of the q-time remaining. If the lot that cannot be reworked has a short or no q-time remaining, the controller 700 in the AMHS outputs a red bar on the priority indicator 216. Controller 700 in the AMHS outputs the yellow bar or a green bar on the priority indicator 216 indicating that the overhead transport vehicle 200 is transporting a lot that can be reworked. If the lot that can be reworked has a short or no q-time remaining, the controller 700 in the AMHS outputs the yellow bar on the priority indicator 216. Thus, the lot that cannot be revived or reworked has a priority over the lot that can be reworked. Controller 700 in the AMHS outputs a green bar on the priority indicator 216 indicating that the overhead transport vehicle 200 is transporting a lot that is not subject to the q-time restriction or is subject to be scrapped or to be reworked. In some embodiments, a lot that is subject to be scrapped or to be reworked has the lowest priority (or urgency). In accordance with the present disclosure, the controller 700 in the AMHS can output the level of urgency in any suitable fashion on the priority indicator 216.

FIG. 3 is a schematic view of the overhead transport vehicle 200 on the overhead track 302 communicating with the controller 700 in the AMHS according to one or more embodiments of the present disclosure.

Referring to FIG. 3, the overhead transport vehicle 200 includes the processing circuit 210, the memory 212, the communication circuit 214, and the priority indicator 216 that indicates the level of urgency for the lot transported by the overhead transport vehicle 200.

In some embodiments of the present disclosure, the processing circuit 210 transmits a rescue signal to the controller 700 in the AMHS when the lot the overhead transport vehicle 200 is transporting has no or very short q-time remaining or the overhead transport vehicle 200 is powered by a limited power source (i.e., backup power source 204). As discussed above, the processing circuit 210 determines the level of urgency for the lot based on the remaining q-time and other conditions (i.e., route information, traffic information, and production deadline) in some embodiments of the present disclosure.

In one or more embodiments of the present disclosure, the fab operator (or q-time remaining for the lot) sets the level of urgency that triggers the processing circuit 210 of the overhead transport vehicle 200 to generate the rescue signal. For a non-limiting example, the highest-level urgency determined by the processing circuit 210 for the lot triggers the processing circuit 210 to generate the rescue signal and in response to receiving the rescue signal from the processing circuit 210, the communication circuit 214 transmits the rescue signal to the controller 700 in the AMHS.

Upon receiving the rescue signal from the processing circuit 210 of the overhead transport vehicle 200, the controller 700 in the AMHS enables its rescue function. The rescue function provides a rescue command to accelerate the moving of the urgent lot by determining the shortest route from the current location of the lot to a destination for the lot and/or increase the speed of the overhead transport vehicle 200. Generally, the destination is set to the next tool location (process step) in the sequence of the process steps. However, when the next tool in the sequence is not available, the controller 700 in the AMHS locates another available tool that can perform the same process step in some embodiments of the present disclosure. If the controller 700 locates a substitute tool, the controller 700 in the AMHS updates the destination to the substitute tool location and determines the shortest route to the substitute tool location from the current location of the lot. In some embodiments of the present disclosure, if the controller 700 is unable to locate the substitute tool, the controller 700 updates the destination to the nearest emergency entrepot 800 and determines the shortest route to the nearest emergency entrepot 800.

In some embodiments of the present disclosure, the AMHS includes an emergency entrepot 800. The emergency entrepot 800 can be in any suitable form, such as a stocker (or cabinet) located near the next tool location (process step). The stocker can be on the fab ceiling or on the fab floor. If an urgent lot is on the stocker on the fab floor, the fab operator can easily move the urgent lot manually to the next location.

In accordance with some embodiments of the present disclosure, the controller 700 in the AMHS transmits a ban signal to other overhead transport vehicles that are on the shortest route. In some embodiments of the present disclosure, the controller 700 in the AMHS also transmits the ban signal to other overhead transport vehicles that are not on the shortest route. In some embodiments, the ban signal includes a re-route command that re-routes other overhead transport vehicles on the shortest route and/or a ban command that prevents and re-routes other overhead transport vehicles from entering the shortest route. As a result, the lot that triggers the rescue signal is rescued by the controller 700 of the AMHS which guides the lot to the shortest route to the next destination.

In some embodiments of the present disclosure, the controller 700 of the AMHS transmits a signal that voids the ban signal when the urgent lot is successfully transported to the destination.

In some embodiments of the present disclosure, a backup controller 702 continuously, regularly, or in a certain pattern monitors and stores the rescue signal the controller 700 of AMHS receives from the overhead transport vehicle 200 (or more than one overhead transport vehicles 200). The stored rescue signal at the backup controller 702 is used when the controller 700 of AMHS fails to operate properly. For a non-limiting example, when the controller 700 of the AMHS (or AMHS) shuts down due to a power failure, the backup controller 702 (which runs on different power source such as backup battery or alternate backup power source) takes over the operation of the controller 700 of the AMHS.

Figure 4:
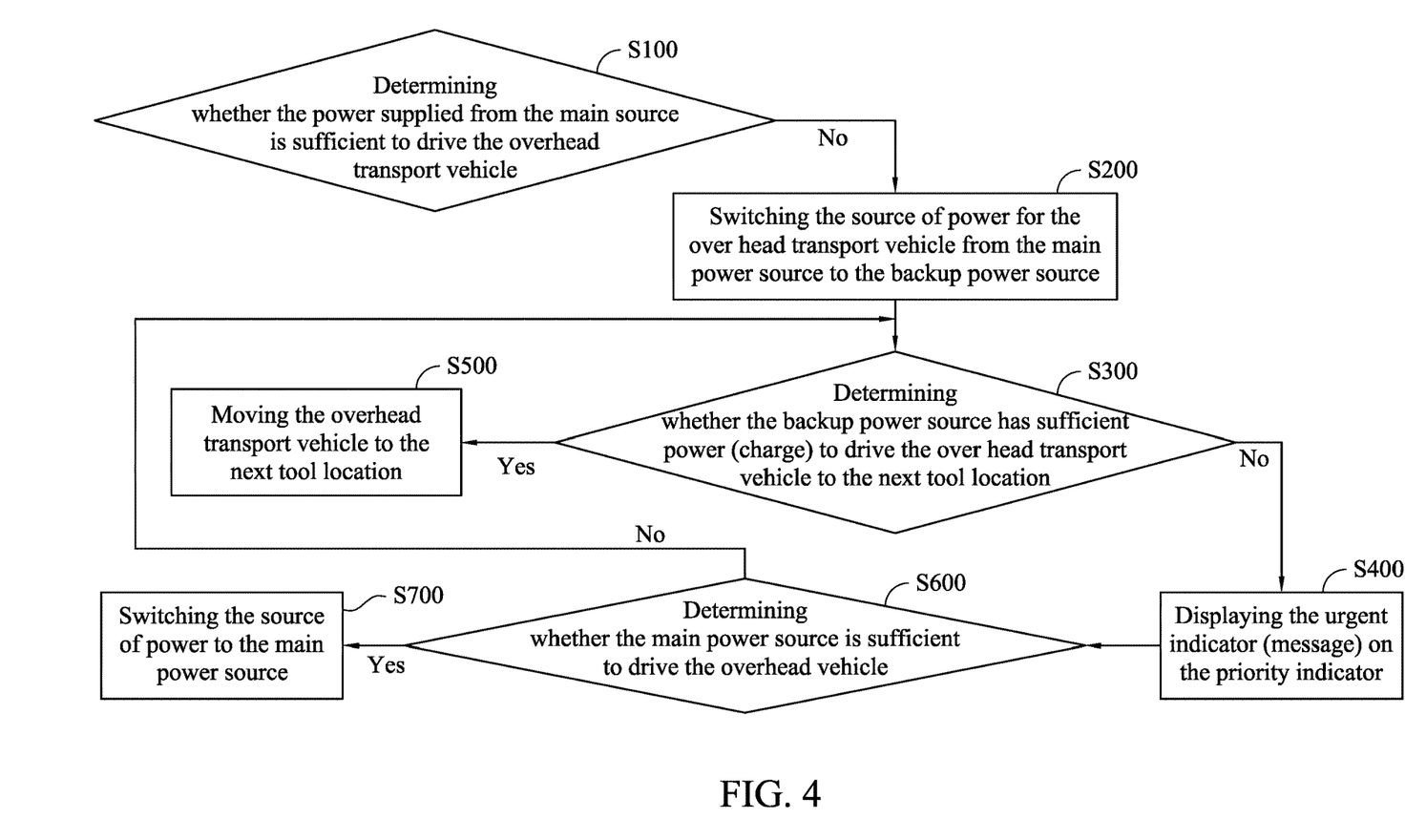
FIG. 4 is a flow chart illustrating a method of determining a source of power for the overhead transport vehicle 200 according to one or more embodiments of the present disclosure.

FIG. 4 is a flow chart illustrating a method of determining the source of power for the overhead transport vehicle 200 according to one or more embodiments of the present disclosure.

Referring to FIG. 4, in accordance with some of the embodiments of the present disclosure, a method of determining the source of the power according to one or more embodiments includes: step S100 of determining whether the power supplied from the main power source is sufficient to drive the overhead transport vehicle 200; step S200 of switching the source of power for the overhead transport vehicle 200 from the main power source to the backup power source 204; S300 step of determining whether the backup power source 204 has sufficient power (charge) to drive the overhead transport vehicle 200 to the next tool location (process step); S400 step of displaying the urgent indicator (message) on the priority indicator 216; S500 step of moving the overhead transport vehicle 200 to the next tool location (process step); S600 step of determining whether the main power source is sufficient to drive the overhead transport vehicle 200; and S700 step of switching the source of power to the main power source.

Step S100 of determining whether the power supplied from the main power source is sufficient to drive the overhead transport vehicle 200 includes a step of monitoring the power supplied from the power rail 304. As discussed above, the power control circuit 202 monitors the source of power and determines the source of power that drives the overhead transport vehicle 200 based on measurements (such as voltage and current) collected during this step. In a typical situation, the overhead transport vehicle 200 is being powered by the power rail 304. Power control circuit 202 measures the power supplied from the power rail 304 continuously, regularly, or in a certain pattern to monitor the power received from the power rail 304. When the power control circuit 202 determines that the power supplied from the power rail 304 is not sufficient (i.e., incorrect current/voltage, and power outage), the power control circuit 202 switches the source of power for the overhead transport vehicle 200 from the power rail 304 to the backup power source 204.

Step S200 of switching the source of power for the overhead transport vehicle 200 from the main power source to the backup power source 204 includes a step of switching the power source for the overhead transport vehicle 200 from the power rail 304 to the backup power source 204. As discussed above, when the power control circuit 202 determines that the power supplied from the power rail 304 is not sufficient (i.e., incorrect current/voltage, and power outage), the power control circuit 202 switches the source of power for the overhead transport vehicle 200 from the power rail 304 to the backup power source 204. As discussed above, the backup power source 204 includes a suitable power storage unit such as a non-rechargeable battery (i.e., alkaline), and a rechargeable battery (i.e., capacitor, lead-acid, NiCd, NiMH, Li-ion, and Li-ion polymer).

Step S300 of determining whether the backup power source 204 has sufficient power to drive the overhead transport vehicle 200 to the next tool location (process step) includes a step of determining whether the backup power source 204 has a capacity (i.e., charge) to drive the overhead transport vehicle 200 to the next tool location (process step) in the sequence of the process steps. In some embodiments of the present disclosure, the power control circuit 202 checks the capacity of the backup power source 204 and the processing circuit 210 determines whether the backup power source 204 has the capacity to drive the overhead transport vehicle 200 to the next tool location (process step). In some other embodiments of the present disclosure, the controller 700 of the AMHS determines whether the backup power source 204 has the capacity to drive the overhead transport vehicle 200 to the next tool location (process step).

Step S400 of displaying the urgent level on the priority indicator 216 includes a step of indicating to the fab operator that the overhead transport vehicle 200 has insufficient power to operate. In some embodiments of the present disclosure, the processing circuit 210 outputs a message on the priority indicator 216 indicating that the overhead transport vehicle 200 has insufficient power. In some embodiments of the present disclosure, the processing circuit 210 outputs at least one of "out of power" urgent message, sequence name, lot identifier, or remaining q-time on the priority indicator 216. In some other embodiments of the present disclosure, the controller 700 of the AMHS outputs the "out of power" urgent message on the priority indicator 216.

In some embodiments of the present disclosure, the processing circuit 210 outputs different levels of an "out of power" urgent message on the priority indicator based on the remaining q-time and other considering factors (i.e., non-reworkable lot and reworkable lot). In some other embodiments, the controller 700 in the AMHS outputs the different levels of the "out of power" urgent message based on the remaining q-time and other factors (i.e., non-reworkable lot and reworkable lot).

For a non-limiting example of methods in accordance with some embodiments of the present disclosure, if the lot has the remaining q-time within a predetermined time range A (such as 420 seconds or less) to get to the next tool location (process step), the processing circuit 210 (or the controller 700 in the AMHS) outputs a red "out of power" urgent message on the priority indicator 216 indicating that the lot has no or very short q-time remaining. Similarly, if the lot has the remaining q-time within a predetermined time range B (such as between 421 seconds and 840 seconds), the processing circuit 210 (or the controller 700 in the AMHS) outputs a yellow "out of power" urgent message on the priority indicator 216 indicating that the lot has short q-time remaining. If the lot has the reminder time within a predetermined time range C (such as between 841 seconds or more), the processing circuit 210 (or the controller 700 in the AMHS) outputs a green "out of power" urgent message on the priority indicator 216 indicating that the lot has enough q-time remaining. Based on the q-time remaining for the lot, the fab operator can determine priority order.

Step S500 of moving the overhead transport vehicle 200 to the next tool location (process step) using the backup power source 204 includes a step of transporting the lot to the next tool location (process step) using the backup power source 204. As discussed above, in some embodiments of the present disclosure, the processing circuit 210 transmits the rescue signal to the controller 700 in the AMHS. Upon receiving the rescue signal from the processing circuit 210, the controller 700 in the AMHS enables its rescue function. The rescue function provides a rescue command to accelerate the moving of the lot by determining the shortest route from the current location of the lot to a destination for the lot. Generally, the destination is set to the next tool location (process step) in the sequence of the process steps. However, when the next tool in the sequence is not available, the controller 700 in the AMHS locates another available tool that can perform the same process step in some embodiments of the present disclosure. If the controller 700 locates a substitute tool, the controller 700 updates the destination to the substitute tool location and determines the shortest route to the substitute tool location from the current location of the lot. In some embodiments of the present disclosure, if the controller 700 is unable to locate the substitute tool, the controller 700 updates the destination to the nearest emergency entrepot 800 and determines the shortest route to the nearest emergency entrepot 800. As discussed above, in some embodiments of the present disclosure, the emergency entrepot 800 can be in any suitable form, such as a stocker located closer to the next tool location (process step). The stocker can be on the fab ceiling or on the fab floor. If the urgent lot is on the stocker on the fab floor, the fab operator can easily move the urgent lot manually to the next location.

In some embodiments of methods in accordance with the present disclosure, the controller 700 in the AMHS determines that insufficient power (i.e., incorrect current, incorrect voltage, and power outage) is supplied through the power rail 304. In response to the insufficient power, the controller 700 in the AMHS enables its rescue function. The rescue function provides a rescue command to accelerate the moving of the lot by determining the shortest route from the current location of the lot to a destination for the lot. Generally, the destination is set to the next tool location (process step) in the sequence of the process steps. However, when the next tool in the sequence is not available, the controller 700 in the AMHS locates another available tool that can perform the same process step in some embodiments of the present disclosure. If the controller 700 locates a substitute tool, the controller 700 updates the destination to the substitute tool location and determines the shortest route to the substitute tool location from the current location of the lot. In some embodiments of the present disclosure, if the controller 700 is unable to locate the substitute tool, the controller 700 updates the destination to the nearest emergency entrepot 800 and determines the shortest route to the nearest emergency entrepot 800. As discussed above, in some embodiments of the present disclosure, the emergency entrepot 800 can be in any suitable form, such as a stocker located closer to the next tool location (process step). The stocker can be on the fab ceiling or on the fab floor. If the urgent lot is on the stocker on the fab floor, the fab operator can easily move the urgent lot manually.

Step S600 of determining whether the main power source is sufficient to drive the overhead transport vehicle 200 includes a step of checking the power supplied from the power rail 304 while the overhead transport vehicle 200 is being powered by the backup power source 204. In some embodiments of the present disclosure, the power control circuit 202 further checks the power supplied from the power rail 304 while the overhead transport vehicle is being powered by the backup power source 204. If the power control circuit 202 determines that the power detected from the power rail 304 is sufficient to drive the overhead transport vehicle 200, the power control circuit 202 switches back the source of the power for the overhead transport vehicle 200 to the power rail 304.

In some embodiments of the present disclosure, the controller 700 in the AMHS further checks the power supplied from the power rail 304 while the overhead transport vehicle is being powered by the backup power source 204. If the controller 700 in the AMHS determines that the power detected from the power rail 304 is sufficient to drive the overhead transport vehicle 200, the controller 700 in the AMHS transmits a command signal to the power control circuit 202 so the power control circuit 202 switches the source of the power for the overhead transport vehicle 200 back to the power rail 304.

Step S700 of switching the source of power to the main power source includes a step of switching the power source from the backup power source 204 to the power rail 304 based on the determination in step S600.

Figure 5:
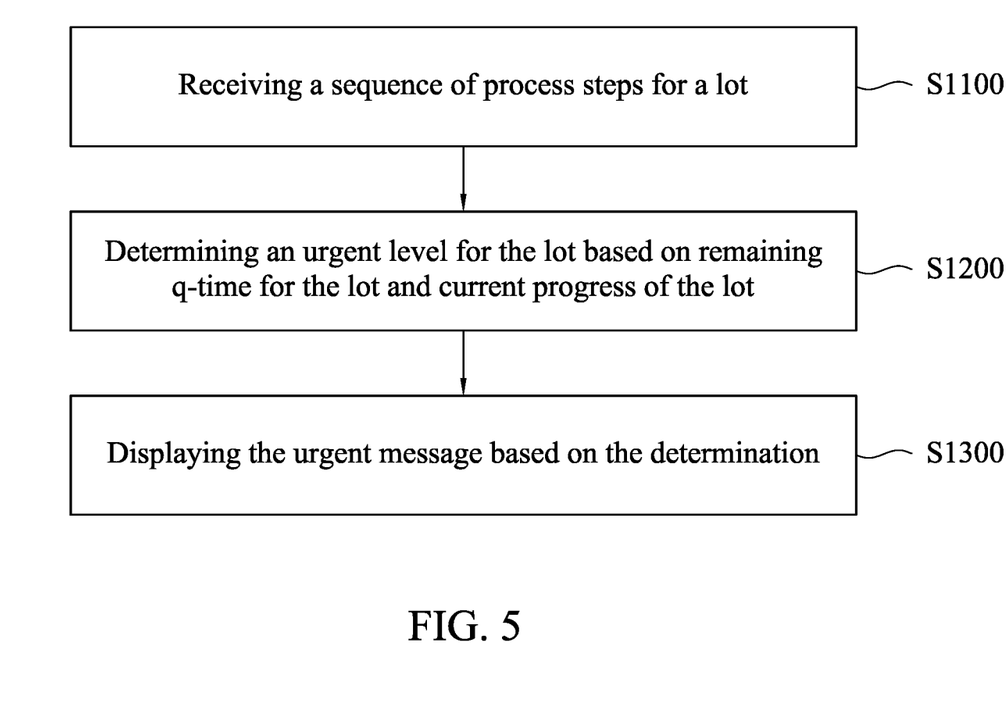
FIG. 5 is a flow chart illustrating a method of determining and displaying an urgent message on the priority indicator 216 according to one or more embodiments of the present disclosure.

FIG. 5 is a flow chart illustrating a method of determining and outputting the urgent message on the priority indicator 216 according to one or more embodiments of the present disclosure.

Referring to FIG. 5, the method of determining and outputting the urgent message on the priority indicator 216 includes: step S1100 of receiving a sequence of process steps for a lot; step S1200 of determining an urgent level for the lot based on remaining q-time for the lot and current progress of the lot; and step S1300 of displaying the urgent message based on the determination.

Step S1100 of receiving the sequence of process steps for the lot includes a step of receiving the sequence of process steps for the lot from the controller 700 in the AMHS. As discussed above, the communication circuit 214 of the overhead transport vehicle 200 receives a sequence of process steps for the lot from a controller 700 in the AMHS. The sequence of process steps includes at least one sequence of process steps (the sequence of different tools that the lot must move through) for the lot. In some embodiments of the present disclosure, along the sequence of process steps, the sequence of process steps includes route information for the lot (i.e., the distance between a preceding tool (process step) and a following tool (process step) in the sequence of process steps). The sequence of process steps includes a time constraint information for intervals between two or more process steps (tools) in the sequence of process steps. As discussed above, the time constraint is often called the q-time. The q-time limits an interval time between two or more tools (or process steps) in the sequence of process steps. As discussed above, the q-time is set to ensure that deposited layers or process structures on the wafers are free from contamination such as excessive oxidation and particles before the wafers are transported to the next tool, or process step in the sequence. Memory 212 stores the sequence of process steps for each of the lots the overhead transport vehicle 200 is assigned to transport. As discussed above, the sequence of process steps includes the q-time data for the lot.

Step S1200 of determining the level of urgency for the lot based on the remaining q-time and current progress of the lot includes a step of determining the urgent level for the lot based on the sequence of process steps stored in the memory 212 and the current progress of the lot in the sequence of process steps. As discussed above, the processing circuit 210 of the overhead transport vehicle 200 determines an urgent level for the lot in accordance with one or more embodiments of the present disclosure.

In some embodiments of the present disclosure, the processing circuit 210 determines the urgent level for the lot transported by the overhead transport vehicle 200 based on the sequence of process steps stored in the memory 212 and current progress of the lot in the sequence of process steps. For a non-limiting example, the processing circuit 210 determines whether the lot being transported by the overhead transport vehicle 200 will be available at the next process step within the remaining q-time. Based on the determination, the processing circuit 210 outputs different indicators on the priority indicator 216 based on the remaining q-time.

Step S1300 of displaying the urgent message based on the determination includes a step of displaying the urgent message on the priority indicator 216 based on the level of urgency determined by the processing circuit 210.

Figure 6:
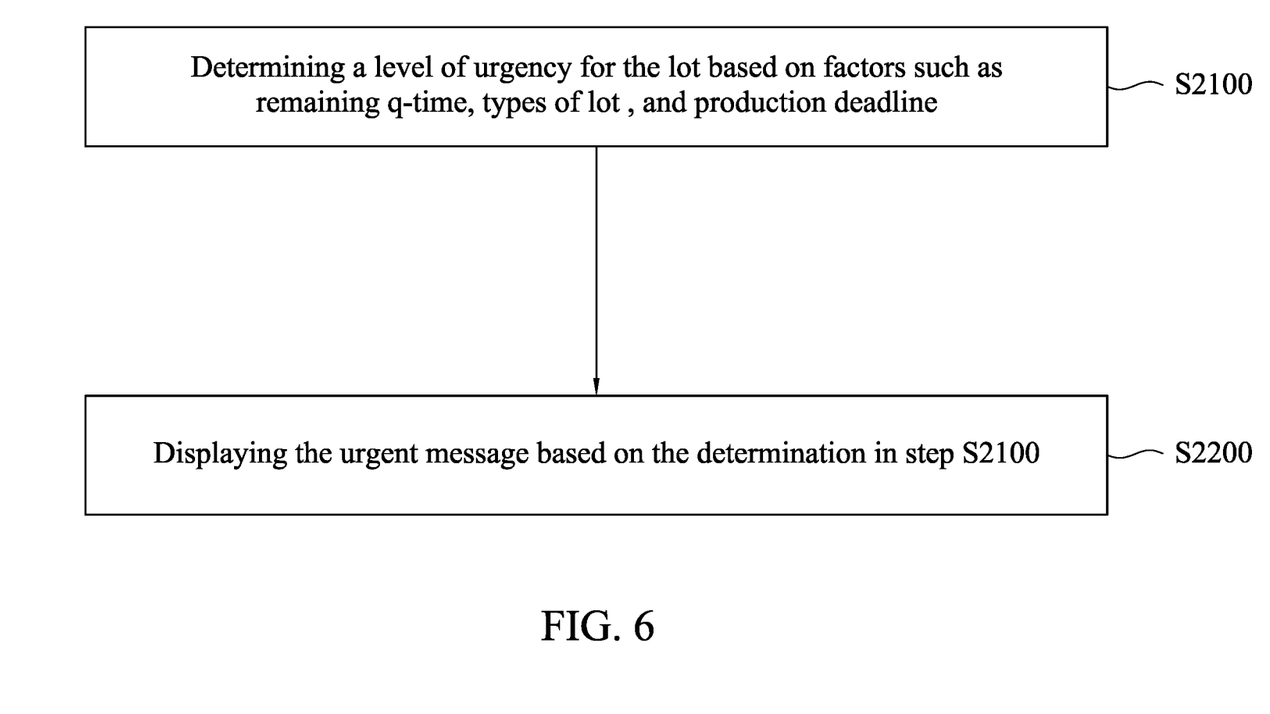
FIG. 6 is a flow chart illustrating another method of determining and displaying the urgent message on the priority indicator 216 according to one or more embodiments of the present disclosure.

FIG. 6 is a flow chart illustrating a method of determining and displaying the urgent message on the priority indicator 216 according to one or more embodiments of the present disclosure.

Referring to FIG. 6, the method of determining and displaying an urgent message on the priority indicator 216 includes: step S2100 of determining a level of urgency for the lot based on factors such as remaining q-time, types of lot, and production deadline; and step S2200 of displaying the urgent message based on the determination in step S2100.

Step S2100 of determining the level of urgency for the lot includes a step of determining the level of urgency for the lot based on one or more considering factors such as remaining q-time, lot type, and production deadline.

In some embodiments of the present disclosure, the controller 700 of the AMHS determines the level of urgency on the priority indicator 216. As discussed above, one or more factors such as the remaining q-time, lot type, and production deadline can be used to determine the level of urgency for the lot.

As discussed above, when a logistic algorithm that controls traffic in the AMHS is unable to transport the FOUP from one tool to the next tool in the sequence of the process steps within the q-time due to unexpected problems, such as power outage, the wafers are often scrapped. However, some of the lots can be saved with further treatment processes such as an etching process to remove particles or an oxidation layer. In other words, a lot that cannot be reworked is classified as a higher urgent lot compared to a lot that can be reworked.

Generally, each of the lots in the production has various production deadlines. A lot with a tighter deadline is classified as a higher urgent lot compared to a lot that is far from the production deadline.

Controller 700 in the AMHS determines the urgency level based on various factors including the remaining q-time, lot type, and production deadline. An AMHS operator assigns different weights for each considering factor so the controller 700 in the AMHS can determine the level of urgency for each lot.

Step S2200 of displaying the urgent message based on the determination includes a step of displaying the urgent message on the priority indicator 216 based on the determination in step S2100.

Figure 7:
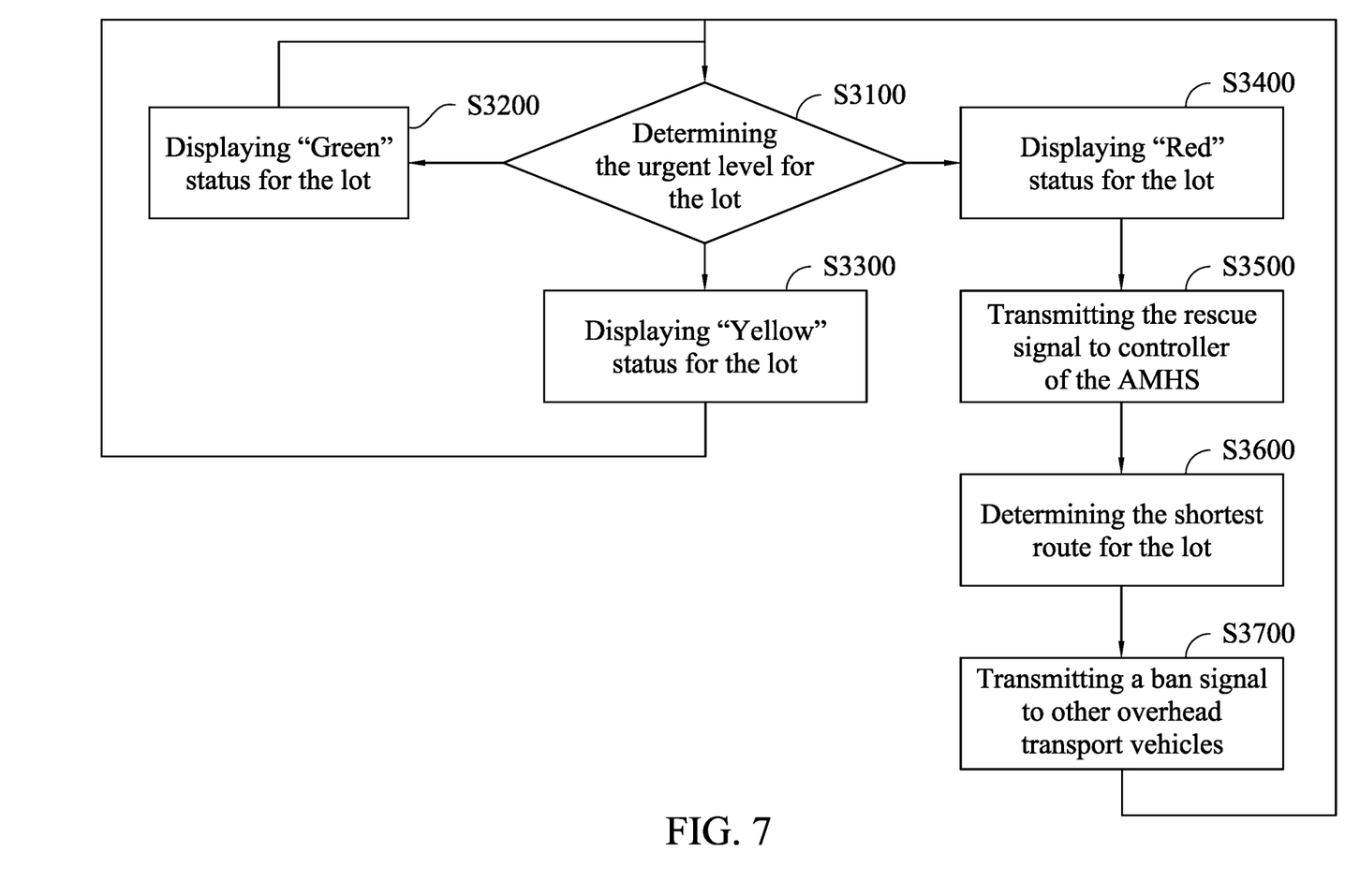
FIG. 7 is a flow chart illustrating a method of transporting an urgent lot according to one or more embodiments of the present disclosure.

FIG. 7 is a flow chart illustrating a method of transporting an urgent lot based on the determined level of urgency according to one or more embodiments of the present disclosure.

Referring to FIG. 7, the method of transporting the urgent lot based on the determined urgent level includes: step S3100 of determining the urgent level for the lot; step S3200 of displaying "green" status for the lot; step S3300 of displaying "yellow" status for the lot; step S3400 of displaying "red" status for the lot; step S3500 of transmitting the rescue signal to the controller 700 of the AMHS (or enabling a rescue function in the controller 700); step S3600 of determining the shortest route for the lot; and step S3700 of transmitting a ban signal to other overhead transport vehicles.

Step S3100 of determining the urgent level for the lot includes a step of determining the level of urgency for the lot based on one or more factors such as the sequence of process steps stored in the memory 212, current progress of the lot in the sequence of process steps, the remaining q-time, the lot type, and the production deadline.

In some embodiments of the present disclosure, the processing circuit 210 of the overhead transport vehicle 200 determines the level of urgency for the lot. Processing circuit 210 determines the level of urgency for the lot transported by the overhead transport vehicle 200 based on the sequence of process steps stored in the memory 212 and current progress of the lot in the sequence of process steps. For a non-limiting example, the processing circuit 210 determines whether the lot being transported by the overhead transport vehicle 200 will be available at the next process step within the remaining q-time. Based on the determination, the processing circuit 210 outputs different indicators (i.e., green, yellow, and red) on the priority indicator 216 based on the remaining q-time.

In some embodiments in the present disclosure, the controller 700 in the AMHS determines the urgency for the lot. The controller 700 in the AMHS determines the urgency level based on various factors including the remaining q-time, lot type, and production deadline. The AMHS operator assigns a different weight for each factor so the controller 700 in the AMHS can determine the level of urgency for each lot. Based on the determination, the controller 700 in the AMHS outputs different indicators (i.e., green, yellow, and red) on the priority indicator 216 based on the remaining q-time.

Step S3200 of displaying a "green" indicator on the priority indicator 216 includes a step of indicating to the fab operator that the lot has the lowest priority.

In some embodiments of the present disclosure, the processing circuit 210 outputs the "green" indicator on the priority indicator 216 when the lot has enough q-time remaining based on the determination by the processing circuit 210 in step S2100.

In some embodiments of the present disclosure, the controller 700 in the AMHS outputs the "green" indicator on the priority indicator 216 when the lot is classified as not an urgent lot.

Step S3300 of displaying a "yellow" indicator on the priority indicator 216 includes a step of indicating to the fab operator that the lot has a medium priority.

In some embodiments of the present disclosure, the processing circuit 210 outputs the "yellow" indicator on the priority indicator 216 based on the determination by the processing circuit 210 in step S3100.

In some embodiments of the present disclosure, the controller 700 in the AMHS outputs the "yellow" indicator on the priority indicator 216 based on the determination by the controller 700 in the AMHS in step S3100

Step S3400 of displaying a "red" indicator on the priority indicator 216 includes a step of indicating to the fab operator that the lot has a high priority.

In some embodiments of the present disclosure, the processing circuit 210 outputs the "red" indicator on the priority indicator 216 based on the determination by the processing circuit 210 in step S3100.

In some embodiments of the present disclosure, the controller 700 in the AMHS outputs the "red" indicator on the priority indicator 216 based on the determination by the controller 700 in the AMHS in step S3100.

Step S3500 of enabling a rescue function includes a step of utilizing the rescue function provided by the controller 700 of the AMHS.

In some embodiments of the present disclosure, the processing circuit 210 determines the level of urgency for the lot based on the remaining q-time and other conditions as discussed above such as production deadline, lot type (reworkable/non-reworkable), and power source to the overhead transport vehicle 200 in step S2100. For non-limiting example, the fab operator (or q-time remaining for the lot) sets the urgent level that triggers the processing circuit 210 to generate the rescue signal. When a lot triggers the processing circuit 210 to generate the rescue signal, the communication circuit 214 of the overhead transport vehicle 200 transmits the rescue signal to the controller 700 in the AMHS.

In some embodiments of the present disclosure, the controller 700 in the AMHS determines that a lot is urgent and enables the rescue function for the urgent lot. As discussed above, the controller 700 in the AMHS uses one or more factors (i.e., remaining q-time, lot type, and production deadline) to determine the level of urgency for the lot.

Step S3600 of determining the shortest route includes a step of determining the shortest route from the current location of the lot to the next destination for the lot.

In some embodiments of the present disclosure, upon receiving the rescue signal from the processing circuit 210 of the overhead transport vehicle 200, the controller 700 in the AMHS enables its rescue function. The rescue function provides the rescue command to accelerate the moving of the lot by determining the shortest route from the current location of the lot to the next destination for the lot. Generally, the destination is set to the next tool location (process step) in the sequence of the process steps. However, when the next tool in the sequence is not available, the controller 700 in the AMHS locates another available tool that can perform the same process step in some embodiments of the present disclosure. If the controller 700 is successful in locating a substitute tool, the controller 700 updates the destination to the substitute tool location and determines the shortest route to the substitute tool location from the current location of the lot. In some embodiments of the present disclosure, if the controller 700 is unable to locate the substitute tool, the controller 700 updates the destination to the nearest emergency entrepot 800 and determines the shortest route to the nearest emergency entrepot 800.

In some embodiments of the present disclosure, the controller 700 in the AMHS enables its rescue function. The rescue function provides the rescue command to accelerate the moving of the lot by determining the shortest route from the current location of the lot to the next destination for the lot. Generally, the destination is set to the next tool location (process step) in the sequence of the process steps. However, when the next tool in the sequence is not available, the controller 700 in the AMHS locates another available tool that can perform the same process step in some embodiments of the present disclosure. If the controller 700 is successful in locating a substitute tool, the controller 700 updates the destination to the substitute tool location and determines the shortest route to the substitute tool location from the current location of the lot. In some embodiments of the present disclosure, the controller 700 updates the destination to a nearest available emergency entrepot 800 from the current location (or to an available emergency entrepot 800 nearest the next tool location) and determines the shortest route to the near emergency entrepot 800 (or to the available emergency entrepot 800 nearest to the next tool location).

Step S3700 of transmitting a ban signal to other overhead transport vehicles includes a step of controlling the traffic on the shortest route. In accordance with some embodiments of the present disclosure, the controller 700 in the AMHS transmits a ban signal to other overhead transport vehicles that are on the shortest route. In some embodiments of the present disclosure, the controller 700 in the AMHS also transmits the ban signal to other overhead transport vehicles that are not on the shortest route. The ban signal includes a re-route command that re-routes other overhead transport vehicles on the shortest route and a ban command prevents and re-routes other overhead transport vehicles from entering the shortest route. As a result, the lot that triggers the rescue signal is rescued by the controller 700 of the AMHS which guides the lot to the shortest route to the next destination.

As discussed above, in some embodiments of the present disclosure, a backup controller 702 continuously, regularly, or in a certain pattern monitors and stores the rescue signal the controller 700 of AMHS receives from the overhead transport vehicle 200 (or more than one overhead transport vehicles 200). The stored rescue signal at the backup controller 702 is used when the controller 700 of AMHS fails to operate properly. For a non-limiting example, when the controller 700 of the AMHS (or AMHS) shuts down due to a power failure, the backup controller 702 (which runs on different power source such as backup battery or alternate backup power source) takes over the operation of the controller 700 of the AMHS.

As discussed above, the AMHS and the overhead transport vehicles 200 (integrated into the AMHS) are able to work together to reduce a number of manual urgent lot rescues by the fab operator. For example, the overhead transport vehicle 200 includes the backup power source 204 that supplies power to the overhead transport vehicle 200 when the power supplied from the power rail 304 fails. Further, the priority indicator 216 provides the level of urgency for the lot. Based on the indication on the priority indicator 216, the fab operator can easily locate and rescue an urgent lot. In additional, the urgent lot can be re-routed to a new destination, such as the nearest available emergency entrepot location on the fab floor, from the original destination (the next tool in the sequence). This makes it easy for the fab operator to manually handle the urgent lot instead of looking for the lot on the overhead track 302. Further, using the overhead transport vehicle 200 described herein reduces wafers being scrapped or reworked.

According to one or more embodiments of the present disclosure, an overhead transport vehicle includes a power control circuit for determining a source of power for the overhead transport vehicle, and a backup power source, wherein the power control circuit switches the source of power from a main power source to the backup power source.

According to one or more embodiments of the present disclosure, an overhead transport vehicle includes a communication circuit receiving a sequence of process steps for a lot from a controller in an Automated Material Handling System (AMHS), the sequence of process steps including a time constraint information for intervals between two or more process steps in the sequence of process steps, a memory storing the sequence of process steps for the lot, a priority indicator disposed on an exterior of the overhead transport vehicle, and a processing circuit outputting an indication on the priority indicator based on a level of urgency for the lot.

According to one or more embodiments of the present disclosure, a method of transporting an urgent lot includes determining an urgent level for a lot. The method includes displaying an urgent level status based on the determined urgent level for the lot. The method includes transmitting a rescue signal to an automated material handling system (AMHS). The method includes determining a shortest route to a destination for the lot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. An overhead transport vehicle comprising:
    a communication circuit, which, in operation, receives a sequence of process steps for a lot from a controller in an Automated Material Handling System (AMHS), the sequence of process steps including a time constraint information for intervals between two or more process steps in the sequence of process steps;
    a memory, which, in operation, stores the sequence of process steps for the lot;
    a priority indicator disposed on an exterior of the overhead transport vehicle; and
    a processing circuit, which, in operation, outputs an indication on the priority indicator based on a level of urgency for the lot.

2. The overhead transport vehicle according to claim 1, wherein the indication on the priority indicator is determined based on a level of urgency.

3. The overhead transport vehicle according to claim 2, wherein the level of urgency is determined by the processing circuit based on at least one of conditions, the conditions including the time constraint information, a lot type for the lot, history data from a similar sequence of process steps, or a production deadline assigned for the lot.

4. The overhead transport vehicle according to claim 3, wherein the lot type includes a reworkable lot and a non-reworkable lot.

5. The overhead transport vehicle according to claim 3, wherein the controller assigns different weights for each of the conditions used to determine the level of urgency.

6. The overhead transport vehicle according to claim 1, wherein the time constraint information limits an interval time between two or more process steps in the sequence of process steps.

7. The overhead transport vehicle according to claim 1, further comprising a backup battery supplying power to the priority indicator when a main source of power to the overhead transport vehicle is not available.

8. A method of transporting an urgent lot, comprising:
    determining an urgent level for a lot with a processing circuit of an overhead transport vehicle that is driven between one or more locations by a driving mechanism of the overhead transport vehicle;
    displaying an urgent level status based on the determined urgent level for the lot, the urgent level status displayed on a priority indicator disposed on the overhead transport vehicle;
    transmitting a rescue signal to an automated material handling system (AMHS) through a communication circuit of the overhead transport vehicle based on the determined urgent level for the lot as determined by the processing circuit of the overhead transport vehicle; and
    determining a shortest route to a destination for the lot, determining the shortest route to the destination of the lot includes:
        if the destination for the lot is set to a next tool location in a sequence of process steps and the next tool location is available, transporting the lot to the next tool location to perform a step of the sequence of process steps; and
        if the destination for the lot is set to the next tool location in a sequence of process steps and the next tool location is not available, transporting the lot to another available tool that can perform the step of the sequence of process steps.

9. The method according to claim 8, further comprising transmitting a ban signal to clear the shortest route to the destination.

10. The method according to claim 8, wherein the urgent level is determined by the processing circuit based on at least one of conditions, the conditions including q-time remaining for the lot, a lot type for the lot, history data from a similar sequence of process steps, or a production deadline assigned for the lot.

11. The method according to claim 8, further comprising a backup power status displayed on a backup power indicator disposed on an exterior of the overhead transport vehicle.

12. The method according to claim 11, wherein:
    when the backup power status indicates failure, a solid red color is displayed on the backup power indicator;
    when the backup power status indicates charging, a solid yellow color is displayed on the backup power indicator; and
    when the backup power status indicates near end of life, a blinking yellow color is displayed on the backup power indicator.

13. An overhead transport vehicle comprising:
    a communication circuit, which, in operation, receives a sequence of process steps for a lot from a controller in an Automated Material Handling System (AMHS), the sequence of process steps including a time constraint information for intervals between two or more process steps in the sequence of process steps;
    a memory, which, in operation, stores the sequence of process steps for the lot;
    a priority indicator disposed on an exterior of the overhead transport vehicle;

a processing circuit, which, in operation, outputs an indication on the priority indicator based on a level of urgency for the lot;

a power control circuit, which, in operation, determines a source of power for the overhead transport vehicle; and a backup power source for the overhead transport vehicle, wherein the power control circuit, in operation, switches the source of power from a main power source for the overhead transport vehicle to the backup power source.

14. The overhead transport vehicle according to claim 13, wherein the power control circuit, in operation, switches the source of power from the main power source to the backup power source when the main power source supplies insufficient power to the overhead transport vehicle.

15. The overhead transport vehicle according to claim 13, wherein the power control circuit, in operation, monitors the power supplied from the main power source when the overhead transport vehicle is powered by the backup power source.

16. The overhead transport vehicle according to claim 15, wherein the power control circuit, in operation, switches the source of power from the backup power source to the main power source when the power control circuit measures sufficient power from the main power source.

17. The overhead transport vehicle according to claim 13, wherein the main power source, in operation, supplies power through a power rail.

18. The overhead transport vehicle according to claim 13, further comprising an indicator, which, in operation, indicates a status of the backup power source.

19. The overhead transport vehicle according to claim 13, further comprising a plug-in connector for the backup power source.

20. The overhead transport vehicle according to claim 13, wherein the backup power source includes a main battery and at least one backup battery.

* * * * *